United States Patent [19]

Loxley et al.

[11] Patent Number: 5,053,359
[45] Date of Patent: Oct. 1, 1991

[54] CRISTOBALITE REINFORCEMENT OF HIGH SILICA GLASS

[75] Inventors: Ted A. Loxley, Mentor; Harold L. Wheaton, Minerva, both of Ohio

[73] Assignee: Pyromatics, Inc., Willoughby, Ohio

[21] Appl. No.: 523,982

[22] Filed: May 16, 1990

Related U.S. Application Data

[60] Division of Ser. No. 328,773, Mar. 24, 1989, abandoned, which is a continuation of Ser. No. 225,051, Jul. 27, 1988, abandoned, which is a continuation of Ser. No. 795,645, Nov. 6, 1985, abandoned.

[51] Int. Cl.$^5$ ................. C03C 10/14; C03B 37/00
[52] U.S. Cl. ............................... 501/4; 65/2; 164/39; 432/262; 501/8
[58] Field of Search .................. 65/2, 13, 33, 108; 164/139; 432/262; 501/4, 8

[56] References Cited

U.S. PATENT DOCUMENTS

| | | | |
|---|---|---|---|
| 3,557,575 | 1/1971 | Beall | 65/33 |
| 3,652,248 | 3/1972 | Loxley et al. | 65/13 |
| 3,776,809 | 12/1973 | Baumler et al. | 65/33 |
| 3,799,836 | 3/1974 | Rogers et al. | 65/33 |
| 3,881,945 | 5/1975 | Trojer et al. | 501/4 |
| 3,929,497 | 12/1975 | Clark-Monks | 65/33 |
| 3,972,704 | 8/1976 | Loxley et al. | 65/157 |
| 4,008,094 | 2/1977 | Beall et al. | 106/99 |
| 4,042,362 | 8/1977 | MacDowell et al. | 65/33 |
| 4,093,017 | 6/1978 | Miller et al. | 164/28 |
| 4,199,336 | 4/1980 | Rittler | 65/2 |

OTHER PUBLICATIONS

"Glass:Science and Technology", vol. 1, 1983, pp. 122-123, 128-129,147,182,415,442 and 443.
"FiberGlass", Mohr et al, 1978, pp. 122-124 and 205-207.
"Encyclopedia of Chem. Tech.", Kirk Othmer, 3rd Ed, 1979, pp. 693-694.
"Handbook of Glass Manufacture", Tooley, 1974, pp. 742-745,901,934 and 935.

*Primary Examiner*—Mark L. Bell
*Assistant Examiner*—Anthony J. Green
*Attorney, Agent, or Firm*—Vincent A. Greene

[57] ABSTRACT

A high-density silica glass article with excellent thermal shock characteristics is formed from a high purity vitreous silica containing an aluminum compound as a crystallization aid and having a dense concentration of cristobalite muclei. The aluminum compound is aluminum oxide, aluminum hydroxide, an aluminum salt, or other aluminum-oxide precursor.

A refractory silica glass crucible made according to the invention has remarkable advantages in a Czochralski crystal-growing process. The entire crucible can be crystallized during the initial melt down in the Cz furnace to provide a cristobalite inner surface which effectively resists attack by the molten silicon to minimize contamination problems during crystal growing.

Another embodiment of the invention relates to a unique drawn silica glass with good flexural strength having fibrous oriented veins of cristobalite embedded in a matrix of vitreous silica and having remarkable resistance to deformation at temperatures of 1500° C. and higher as are encountered in certain ferrous casting and investment casting processes.

20 Claims, 4 Drawing Sheets

CRISTOBALITE REINFORCEMENT OF HIGH SILICA GLASS

This is a division of copending application Ser. No. 328,773, filed Mar. 24, 1989, which is a continuation of application Ser. No. 225,051, filed July 27, 1988. The latter application is a continuation of parent application Ser. No. 795,645, filed Nov. 6, 1985, all now abandoned, the entire disclosure of which is incorporated herein by reference.

The present invention relates to the use of cristobalite in refractory silica glass articles and in high temperature processes such as are used in the semiconductor industry and in the investment casting industry. It involves the manufacture or fabrication of a wide variety of refractory articles, including mold parts and cores, receptacles, rods, tubes, supports, linings, rings, ropes, sleeves, covers, crucibles, and the like. One embodiment of the invention relates to a process for producing silica glass tubes, rods, strips, sheets, filaments and fibers containing oriented veins of insituformed cristobalite in a matrix of vitreous silica.

BACKGROUND OF THE INVENTION

While cristobalite has certain advantageous physical properties, it creates serious problems in refractory silica articles, particularly because of the extreme volume changes during the crystallographic alpha-beta inversion. The inversion can be catastrophic in high-density silica products, and, for this reason, the presence of crystalline silica in a silica glass has generally been considered undesirable. The semiconductor industry, for example, has heretofore believed that the silica used to make glass crucibles for Cz crystal-growing furnaces should be vitreous silica of high purity which is free of substantial amounts of cristobalite.

For similar reasons, the investment casting industry has avoided crystalline silica in silica glass cores. The presence of a few percent of alpha cristobalite in a full density glass core can cause an intolerable reduction in the modulus of rupture at 25° C. and a substantial loss of thermal shock resistance without significantly improving the high temperature properties of the core.

Although it is well known that cristobalite has high-temperature sag resistance better than that of amorphous silica, those skilled in the art have been more concerned with the problems created by cristobalite than with its potential advantages as a refractory. One reason for lack of interest in cristobalite in the field of refractory silica glass is the difficulty of inducing crystallization in high-purity silica. The conversion of amorphous silica to cristobalite is difficult due to the very slow growth rate of the crystalline phase. For example, more than one hundred hours may be required to cause complete conversion of a silica crucible to the crystalline state. A further difficulty is that nucleation of cristobalite is only possible at free surfaces of the amorphous phase.

Because of the unknown and unpredictable nature of the crystallization process, those skilled in the art have been firmly convinced that cristobalite is an unreliable and undesirable material in high density refractory silica glass, particularly in glass cores and Cz crucibles.

Vitreous silica is also a preferred refractory material in the investment casting industry for manufacture of leachable cores. Although the internal air cooling passages in the blades and vanes of modern jet engines are usually formed by ceramic cores rather than glass cores, the smaller compressor or turbine airfoils having cooling passages with a diameter for 0.3 mm to 1.5 mm preclude the use of ceramic cores. In such small diameters, ceramic cores have no utility. Only silica glass provides the strength required for wax injection and metal casting when using the smaller cores.

Full density vitreous silica core made by glass drawing have been used for many years in the investment casting industry. They are used, for example, in a conventional investment casting process in which the shell mold and the core are preheated to a high temperature, such as 1000° C., and a molten alloy at a temperature of 1450° C. to 1550° C., or higher is poured into the mold cavity. The process is usually conducted under a vacuum and produces cast metal structures having a multiplicity of fine equiaxed grains and referred to as "equiaxed" castings. The dimensional stability problem becomes more severe with vitreous silica cores as the metal pouring temperature increases. However, the use of full-density silica glass cores in equiaxed casting processes has been very successful. The glass cores are generally well suited to such processes because they have good strength and excellent thermal shock resistance.

In recent years, there has been a trend toward use of the directional solidification (D.S) casting process in the manufacture of turbine airfoil components which produces a columnar grain structure extending from one end of the part to the other. The D.S. castings have high temperature properties far superior to those of their equiaxed counterparts. In the D.S. casting process, the mold, which is open at the bottom end, is placed on a copper chill plate and the metal casting is progressively solidified and gradually cooled as by gradually lowering the chill plate away from the heating zone (see U.S. Pat. Nos. 3,700,023 and 4,093,017). In this process, the mold is usually preheated to a temperature of from 1350° C. to 1500° C. or higher and a molten superalloy is poured into the mold at a temperature above 1500° C.

The D.S. casting subjects the refractory molds and cores to much higher temperatures for longer times than the equiaxed casting process. In a typical D.S. process, the mold can be subjected to a temperature above 1450° C. for one-half hour to one hour or more. Under these conditions, a vitreous silica core, which is a glass, is subject to viscous flow and will distort and move or sag. The core cannot support its own weight. At a lower temperature, such as 1350° C., the viscosity of the glass is much higher and little distortion will occur unless a substantial external load is applied. Because of the lower temperatures employed in equiaxed casting, full density vitreous silica cores are able to function satisfactorily in an equiaxed casting process even though they are unacceptable for D.S. casting.

In the case of porous ceramic cores, improved resistance to deformation during the D.S. casting process can be achieved by devitrifying the core and converting a major portion of the vitreous silica to cristobalite as disclosed in U.S. Pat. No. 4,093,017. Unfortunately, the process disclosed in that patent is not applicable to high-density glass cores (e.g., because of the catastrophic crystallographic alpha-beta inversion problem). A relatively small percentage of crystalline silica in a high density glass core will crack or shatter the core because of the large volume change which occurs when the silica changes from the alpha to the beta form or vice versa (see U.S. Pat. No. 3,540,519).

The crystallographic alpha-beta inversion occurs whenever crystalline silica is heated or cooled through the temperature range of from about 180° C. to 250° C. The problem is particularly severe with respect to cores used in precision investment casting.

There are a number of reasons why cristobalite has been considered intolerable in glass crucibles used for Cz crystal-growing furnaces. The extreme vertical temperature gradients in such furnaces and the severe operating conditions during crystal growth magnify the problems created by cristobalite. Experience has demonstrated that minute amounts of crystalline silica cause crucible deterioration and failure of the vitreous silica crucibles and that crucibles entirely free of cristobalite avoid such problems.

During the last decade, the semiconductor industry has insisted that slip-cast crucibles used in Cz crystal-growing furnaces be free of cristobalite and that such crucibles be sintered at a temperature above 1750° C. long enough to eliminate all of the crystalline silica.

SUMMARY OF THE INVENTION

The present invention is a giant step forward in the field of silica technology and provides simple and practical solutions to the problems described above. The invention makes it possible to achieve a dramatic change in the high temperature properties of silica glass by formation of cristobalite while retaining high strength and advantageous thermal shock properties and avoiding serious damage due to the crystallographic alphabeta inversion. The invention provides a means for solving problems in the field of high-temperature refractories which heretofore appeared to be insuperable.

In the semiconductor field, the invention provides a process for making improved glass crucibles for growing silicon crystal. In the field of high-temperature refractories, the invention provides a process for fabricating a variety of silica glass products having outstanding properties at temperatures above 1500° C. including cores for use in ferrous casting or superalloy investment casting processes.

The invention involves the discovery of a unique glass structure in which fibrous oriented veins of insitu-formed cristobalite are embedded in a continuous matrix of vitreous silica. This unique structure provides a number of unexpected advantages. First, there is a remarkable increase in viscosity and resistance to deformation at high temperatures, such as 1500° C., which can be achieved with a relatively small amount of cristobalite. The partially devitrified silica seems to act like a fiber-reinforced material Second, the unique veined structure resists the catastrophic effects of the alpha-beta inversion so that substantial amounts of cristobalite can be tolerated, even in silica glass articles having a density in excess of 90 percent including full density glass.

The drawn glass with its unique veined structure has potential value in many areas because of the number of fabrication methods available and the ease with which the glass material can be shaped and united or joined together. Modern fiberglass technology and various winding, drawing, pressing and shaping techniques can be employed.

In accordance with one embodiment of the invention, a refractory composition is prepared containing at least 99 percent by weight of fine vitreous silica particles and a metal oxide which promotes the formation of cristobalite. The composition is molded or shaped to provide a preform which is heated to a temperature sufficient to permit viscous flow and then drawn, rolled, extruded or otherwise extended or deformed to reduce its cross-sectional area at least 90 percent and to provide a glass structure in which oriented striations or veins are formed in a matrix of vitreous silica.

These striations provide a multiplicity of internal nucleation sites for the formation and growth of veins of cristobalite when the silica glass is heated to a temperature of 1200° C. or above for a substantial period of time. In order to achieve the desired nucleation and growth of cristobalite at these sites, a crystallization aid is employed, preferably an aluminum compound. Such aid may include oxides of aluminum, an alkaline earth metal and/or other metal and preferably consists predominantly or entirely of aluminum oxide or an aluminum compound which forms aluminum oxide.

The narrow semicontinuous oriented veins of cristobalite formed by devitrification of the glass at the striations act like fibrous reinforcement to cause a remarkable increase in the resistance of the silica glass to deformation at a high temperature, such as 1450° C. or 1500° C. A few percent of cristobalite concentrated in such fibrous veins can increase the viscosity of the glass tenfold at such high temperature without destroying the thermal shock resistance of the glass tube or filament. The process makes it possible to provide stringy silica glass filaments with viscosities 2 orders of magnitude greater than that of high purity fused silica in the temperature range of 1450° C. to 1500° C.

The glass filaments or fibers produced according to the invention are suitable for fabrication of refractory mold parts or cores for D.S. casting of turbine engine components. For example, drawn glass tubes with a diameter from 1 to 2 mm made according to the invention can be bent or shaped for use as turbine blade cores in a conventional D.S. casting process. Such high-density glass cores can be provided with a viscosity at 1450° C. substantially in excess of $10^{12}$ poise and with a high modulus of rupture at room temperature so that they perform very well in the D.S. casting process. The composition of the cores is preferably such that preheating of the core for 20 to 30 minutes in a normal D.S. cycle further increases the resistance of the glass to viscous flow before the molten metal is poured into the mold.

In one embodiment of the invention, a solid or hollow prefrom formed from fine particles of high-purity vitreous silica (as by slip casting) and containing a small amount of added aluminum oxide is heated to the viscous state and drawn to form a high-density glass filament, rod or tube with the aforesaid internal striated structure and is subsequently heat treated for 1 to 10 hours at a temperature of from 1200° C. to 1300° C. to provide a small amount of cristobalite, such as 0.5 to 6 percent by weight, and a high density of cristobalite nuclei at the nucleation sites provided by the striations. Prior to the completion of such heat treatment, the filament or tube is preferably heated under a high vacuum for 1 to 4 hours or so to remove sodium ions and chemically combined water and t minimize the hydroxyl content of the glass.

In the field of Cz silicon crystal manufacture, the present invention provides for the first time a slip-cast cristobalite crucible having predictable properties which can easily be manufactured at low cost using e.'sting equipment and which can be employed like conventional crucibles in existing Cz crystal-growing furnaces.

With respect to the problem of melt contamination, the invention is a potential breakthrough of importance to the industry. For some reason, the smooth inner surface of a crucible made according to the invention, when converted to cristobalite, is very durable and has a resistance to attack by molten silicon much greater than that of amorphous silica. Test samples of cristobalite crucibles used to grow silicon crystal in a Cz furnace suggest that the present invention may be a breakthrough and may make it possible to increase greatly the useful life of a crucible and to reduce greatly the contamination of the silicon melt.

When making crucibles according to the invention, a refractory composition is employed which consists essentially of high-purity vitreous silica particles that contain preferably no more than 0.01 percent by weight of metal oxides other than aluminum oxide. The refractory composition contains a small amount, such as from 0.01 to 0.1 percent by weight, of added aluminum oxide particles to promote cristobalite formation in a uniform and predictable manner.

The crucible is preferably formed by slip casting and is dried and fired and then sintered to high density at a high temperature, such as 1500° C. to 1700° C. Prior to sintering, the porous crucible is heated in a vacuum furnace to a temperature above 1100° C. to remove sodium ions and to minimize the hydroxyl content of the glass.

The glass of the crucible is provided with a multiplicity of crystallization-promoting sites as by incorporating a few percent of alpha-cristobalite particles in the aforesaid refractory composition or by heating the glass during or after sintering to a temperature of 1200° C. or higher to seed the glass with a high concentration of cristobalite nuclei. Such heat treatment forms only a limited amount of cristobalite (i.e., 0.4 to 3 percent by weight or less) so that the glass retains good thermal shock properties and room temperature strength and is not damaged significantly by sudden volume changes during the crystallographic alpha-beta inversion.

The formation of cristobalite nuclei can be facilitated by carrying out the sintering operation in an atmosphere of argon or other inert gas or by otherwise controlling the sintering to provide the final sintered glass with some porosity (i.e., from 0.3 to 3 percent).

If the cristobalite nuclei are provided by alpha cristobalite particles (i.e., with a particle size of 1 to 5 microns), then the final sintering temperature must be kept below 1750° C. and below the melting point of cristobalite. If the internal pores of the glass plus the aluminum oxide are relied upon to promote nucleation of cristobalite, then the final sintering temperature can be as high as 1750° C. If the final sintering removes essentially all of the cristobalite in the glass, then a subsequent heat treatment at a temperature of from 1200° C. to 1500° C. provides the necessary nucleation.

By providing the silica glass of the crucible with a dense concentration of cristobalite nuclei and with aluminum oxide as a crystallization aid, it becomes possible to convert the entire crucible from the amorphous to the crystalline state in a relatively short period of time by heating the glass to a high temperature, such as 1400° C. or 1500° C.

The aluminum oxide provides remarkable results and makes it possible to overcome the slow kinetics associated with the nucleation and growth of cristobalite while at the same time providing a degree of reliability and predictability in the crystallization process which heretofore appeared to be unattainable. The use of an aluminum compound to promote crystallization makes it possible for the first time to provide a cristobalite crucible with the reliability which is essential for Cz crystal growing.

The conventional amorphous silica crucibles used in Cz furnaces are advantageous in that they are not damaged during the initial melt down. However, the vitreous silica is attacked by the molten silicon so that excessive amounts of oxygen and other contaminants are introduced from the glass to the melt.

The contamination problem becomes even more serious as the smooth interior surface of the crucible deteriorates and becomes rough and uneven. For this reason, the conventional vitreous silica crucible is not suitable for reuse after the Cz crystal-growing operation is completed. The unique cristobalite crucible of this invention functions in a different manner because the inner surface can resist attack by the molten silicon. The cristobalite crucible can be reused 2 to 5 times or more before it is discarded.

An object of the invention is to provide a process for making a unique axially-oriented silica glass structure with good low temperature properties and exceptional resistance to deformation at temperatures above 1500° C. suitable for fabrication of silica glass cores, mold parts and other refractory products.

Another object of the present invention is to minimize crucible costs in the Cz crystal-growing process by providing a cristobalite crucible which can be kept hot and reused to grow more than one silicon monocrystal.

These and other objects, uses and advantages of the invention will become apparent to those skilled in the art from the drawings and description which follow.

DESCRIPTION OF THE PREFERRED EMBODIMENTS

Figure 2:
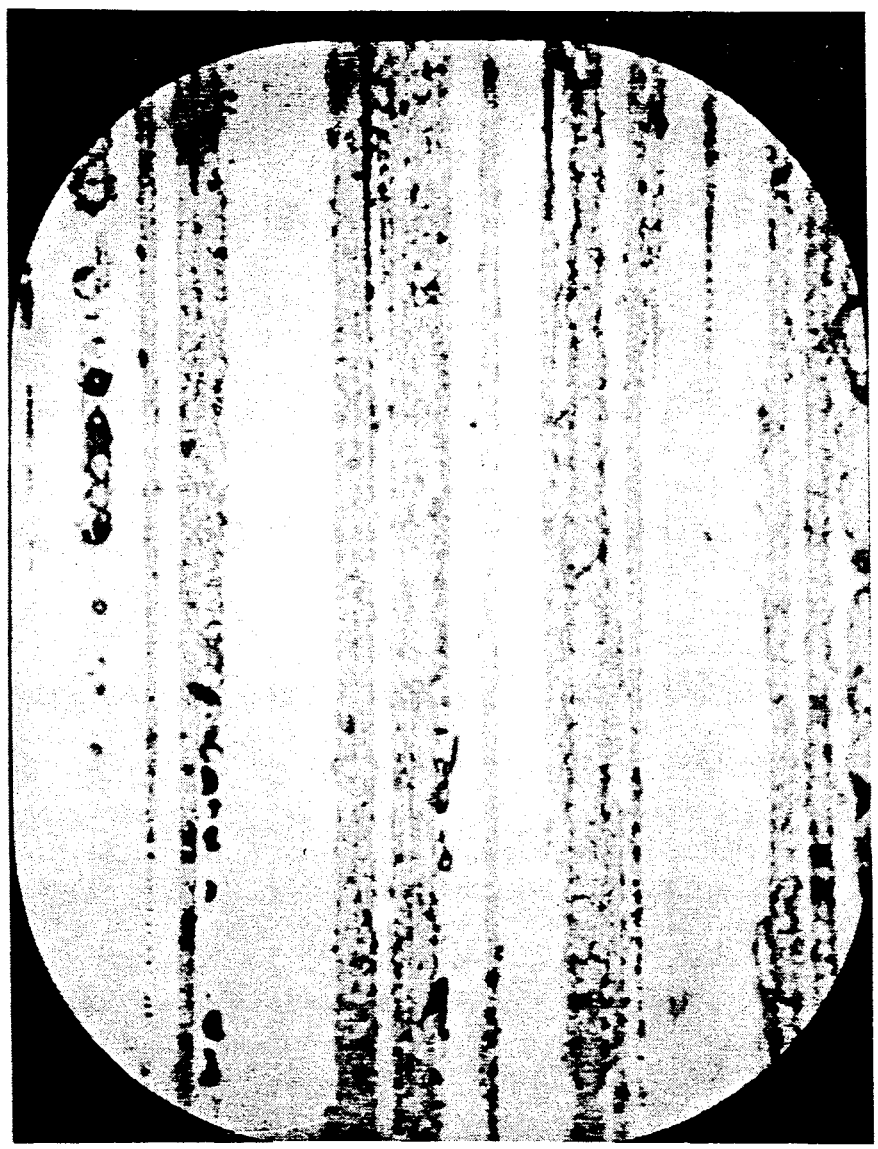
FIG. 2 is an enlarged photograph showing the veined structure of a silica glass made according to the invention.

The present invention is particularly concerned with the manufacture of high-purity silica glass from fine particles of vitreous silica and with the use of aluminum compounds, such as aluminum hydroxide, to promote nucleation and growth of cristobalite. Although the invention is applicable to many refractory articles requiring high resistance to deformation at high temperatures, such as 1500° C. to 1600° C., it is particularly well suited to the manufacture of glass cores and glass crucibles. One of the preferred embodiments described herein relates to improved glass cores for directional solidification (D.S.) casting (see FIGS. 6 to 8).

The invention is concerned with high-density glass made from high-purity silica and having internal surfaces providing a multiplicity of nucleation sites for initiating crystallization. The term "silica glass" as used herein generally refers to vitreous silica but does not exclude small amounts of crystalline silica. The term "high-density" as used herein with respect to a silica article refers to a density of at least 96 percent by weight. Unlike glass, a typical ceramic core is porous and may have a porosity in excess of 20 volume percent.

The term "high-purity" as used herein in connection with silica particles refers to a silica with a purity of at least 99.5 percent (i.e., that contains no more that 0.5 percent by weight of impurities after it is heated to eliminate combustibles).

The term "high vacuum" as used herein in connection with a vacuum furnace indicates a subatmospheric pressure not in excess of 1 millimeter of mercury. A high vacuum may be preferred when reducing the hydroxyl content of the silica glass to a low level, such as 0.002 weight percent, in accordance with the invention.

The term "beta OH value" is used in its normal sense to indicate the hydroxyl concentration of a silica glass as measured in the conventional manner by infrared spectroscopy according to U.S. Pat. No. 4,072,489 (i.e., at an appropriate wave length of a few microns). Because the optical density or (OH) absorption coefficient, beta, of silica glasses as measured by an infrared spectrophotometer is about ten times the hydroxyl concentration, an infrared-absorption beta OH value of 0.04 indicates a hydroxyl concentration of about 40 ppm.

It will be understood that, unless the context suggests otherwise, parts and percentages are by weight rather than by volume.

Conventional viscosity measurements are employed to quantify high-temperature deformation resistance of the glass crystalline composites produced according to the invention. Such silica glass is not totally amorphous, and the term "viscosity" as used herein is intended to describe the apparent or measured viscosity of the cristobalite-reinforced glass.

The vitreous silica used in the practice of this invention is preferably a fused quartz obtained from quartz sand or rock crystal having a purity of at least 99.95 percent by weight. It may be pulverized in various ways without introducing significant amount of impurities, as in a ball mill having balls or stones formed of essentially-pure quartz glass or vitreous silica.

When preparing glass cores or glass crucibles in accordance with the preferred embodiments of the invention, it is particularly important to avoid substantial amounts of harmful impurities. The purity of the silica used to form the glass should be at least 99.95 percent and is preferably at least 99.98 percent by weight. A substantial amount of aluminum oxide, such as 0.05 percent by weight, can be tolerated, but the amount of metal oxide impurities other than aluminum oxide should be less than 0.02 percent and is preferably no more than 0.01 percent by weight.

Best results are obtained when using a high purity silica containing no more than 0.1 percent by weight of aluminum oxide and no more than 0.005 percent by weight of other metal oxide impurities.

For example, excellent results can be obtained in accordance with the invention using treated high-purity vitreous silica containing an amount of aluminum oxide below 100 ppm (parts per million) and amounts of sodium, potassium, calcium, magnesium and iron oxides which total from 10 to 50 ppm. Such silica may, for example, have a sodium content up to 10 ppm, a potassium content up to 5 ppm, a calcium content up to 30 ppm, a magnesium content up to 20 ppm and an iron content up to 10 ppm. Commercial fused silica is available for use in the practice of this invention which has been treated to provide a purity in excess of 99.99 percent and which has an aluminum oxide content from 10 to 50 ppm, a calcium oxide content under 10 ppm, a alkali metal oxide content under 5 ppm, a magnesium oxide content under 5 ppm and an iron oxide content under 5 ppm.

The silica used in making the glass cores and crucibles according to the invention is a vitreous silica which is preferably essentially free of crystalline silica and preferably contains less than one percent by weight of cristobalite. The latter is avoided because of the destructive alpha-beta inversion. However, as pointed out hereinafter, very fine particles of alpha cristobalite can be useful in providing internal nucleation sites in the glass to promote cristobalite growth and can be employed for that purpose in a small amount, such as 2 to 4 percent by weight, when making glass crucibles.

In the manufacture of glass cores and crucibles, the aluminum oxide added to the silica composition to promote the formation of cristobalite is preferably a high-purity material, and the amounts of sodium, potassium and calcium should be limited. The aluminum oxide preferably has an average particle size below 10 microns for slip casting and can have a purity of 99.5 percent or higher, but good results can be obtained using commercial materials with a purity of 98 to 99 percent. For example, the addition of 2000 ppm of aluminum hydroxide containing 0.5 percent of calcium oxide results in the addition of only 10 ppm of calcium oxide to the silica composition. Generally, the total content of oxides of sodium, potassium, calcium, magnesium and iron in the aluminum oxide employed in the practice of this invention is under 1 percent and preferably under 0.5 percent by weight.

Satisfactory results can be obtained using various commercial materials, such as aluminum hydroxide made by J. T. Baker Co., containing about 98.9 percent by weight of aluminum hydroxide. Other hydrated aluminum oxides may also be used.

Excellent results can be obtained in the practice of this invention using commercially available treated vitreous silica with a purity of at least 99.99 percent, and it is preferred to use such purified silica. For example, such silica typically contains about 1 to 2 ppm of sodium, about 1 ppm of potassium, about 1 to 3 ppm of iron, about 2 ppm of magnesium, and no more than 5 ppm of calcium. The aluminum oxide content is less important and can, for example, be in the range of from 10 to 40 ppm or somewhat higher.

Calcium contamination will occur if slip casting is carried out in conventional plaster of Paris molds instead of special coated molds or silica molds. Such contamination may result in a calciu oxide content substantially greater than 50 ppm at the outer surface of the slip-cast crucible or preform. This does not create a serious problem, however. The average calcium content in the slip-cast article is not excessive. Furthermore, the calcium contamination does not occur at the inside surface of the crucible where it is important.
Note that the outer surface can be sandblasted to minimize calcium contamination.

An excessive hydroxyl concentration is more of a problem than calcium contamination. The glass cores and crucibles made according to the present invention are preferably substantially free of chemically-combined water as the result of treatment in a vacuum furnace. The furnace is employed to remove chemically-combined water and any excess sodium ions and to reduce the hydroxyl content to a low value, such as 0.001 to 0.004 percent by weight.

The vacuum treatment may be provided before or after the shaped article is sintered to high density. When making crucibles, it is applied to the porous slip-cast crucible. When the glass is drawn using an oxy-hydrogen flame which introduces water into the glass, the vacuum treatment in the furnace is applied to the drawn glass, usually after it is cut into sections.

In either procedure, the shaped silica body is heated in the vacuum furnace to a temperature of from 1050° C. to 1200° C. for 1 to 3 hours or more while maintaining a subatmospheric pressure below 20 torrs (e.g., from 0.5 to 5 torrs) and preferably below 10 torrs and low enough to remove essentially all of the chemically-combined water, to provide an hydroxyl concentration below 0.005 percent by weight, and to provide the glass with excellent optical transmittance in the near infrared and with a beta OH value below 0.04 at the applicable wave length (i.e., somewhat below 3 microns).

The term "vacuum treatment" as used herein refers to such heating of the glass under vacuum to minimize the hydroxyl concentration. When making glass crucibles, such vacuum treatment is provided before the porous shaped body is heated above 1400° C. to coalesce the silica. When making glass cores, the vacuum treatment may be important if the water content of the glass would otherwise exceed 0.1 percent by weight because of the damage which would otherwise result during crystallization when the core is at a high temperature.

When making glass cores for monocrystal casting or other D.S. casting, the vacuum treatment described above is preferably employed to reduce the hydroxyl concentration in the core to no more than 0.01 percent by weight. For example, when casting metal parts by the D.S. process using typical glass cores made according to this invention (e.g., with diameters of from 1 to 2 mm), it is desirable to employ cores having a hydroxyl concentration of from about 0.001 to about 0.006 percent by weight or lower.

The term "D S. process" is sometimes used in a narrow limited sense to describe the original directional solidification process wherein the metal casting is formed with a columnar structure resulting from direct contact with the metal chill plate at the bottom of the mold. That original process is identified herein as a "columnar casting process". The abbreviation "D.S." and the term "directional solidification" are used herein in the broad generic sense to cover both the columnar process and the well-known monocrystal casting process.

The refractory silica compositions employed in the practice of this invention preferably consist essentially of high-purity vitreous silica and from about 0.02 to about 0.4 percent by weight of aluminum oxide as an additive to promote growth of cristobalite. The amount of aluminum oxide is usually from about 0.04 to 0.3 percent. Optionally, other cristobalite-promoting compounds can be added as crystallization aids or to provide cristobalite nuclei.

The optimum amount of added aluminum oxide in the silica composition depends on the type of glass product being made. Generally, the amount of added aluminum oxide in a composition used for making glass crucibles is no more than 0.2 percent, preferably in the range of from about 0.01 to about 0.1 percent by weight. When making glass cores for D.S. casting, the amount of added aluminum oxide is preferably in the range of from about 0.1 to about 0.4 percent by weight. The amount of added aluminum oxide may be increased enough to offset any losses during processing as may occur, the example, during heating or during high-temperature vacuum drying operations.

The optimum amount of luminum oxide in the silica composition depends on a number of variables including the physical properties sought in the glass article, the amount of cristobalite desired, and the temperature conditions during use of the article. The amount used in making a silica glass core for monocrystal casting or other D.S. casting is usually at least 0.1 percent and such that the drawn glass core has a viscosity at 1450° C. of at least $10^{12}$ poise and preferably at least 1.5 times $10^{12}$ poise. The viscosity depends, of course, on the degree to which the glass is extended during the glass-drawing operation.

The maximum amount of cristobalite in the core as it leaves the factory depends on the core diameter and is preferably no more than 8 percent by weight in cores with a diameter less than 3 millimeters, Greater amounts can be tolerated in cores of larger diameter.

The degree of nucleation in the glass core or other glass articles and the amount of aluminum oxide may be such that heating of the core for one hour at a temperature of 1450° C. will increase the cristobalite content above 10 percent and provide the article with a viscosity at 1500° C. of at least 4 times $10^{12}$ poise.

When making silica glass crucibles, the time required to convert the glass from the vitreous to the crystalline state depends on the amount of aluminum oxide and also on the concentration of cristobalite nuclei per unit volume resulting from the nucleation of the glass. The crucibles of this invention may contain an amount of aluminum oxide in excess of 0.04 percent and a dense concentration of cristobalite nuclei such that at least 90 percent by weight of the crucible is converted to beta cristobalite in a time period of 2 to 4 hours or less when the entire crucible is maintained at a temperature of 1400° C. Such a high rate of crystallization is desirable for crucibles used in Cz crystal-growing furnaces.

Such a high rate of crystallization is not essential in glass cores used in the D.S. casting process because a viscosity (at 1450° C.) well in excess of $10^{12}$ poise can be provided in the core leaving the factory before the core is used in a mold for D.S. casting. The stringy oriented veins of cristobalite in the glass core provide the required resistance to deformation at high temperature.

In order to provide a silica glass with the necessary oriented striations and adequate internal surface area for proper cristobalite growth, it is necessary to extend the porous sintered silica preform and reduce the cross-sectional area at least 90 percent. This reduction is preferably obtained in a glass-drawing operation and is preferably at least 95 percent so that the drawn glass when partially crystallized can develop a high resistance to deformation at high temperatures (i.e., a viscosity substantially greater than $10^{12}$ poise at 1450° C.).

Figure 1:
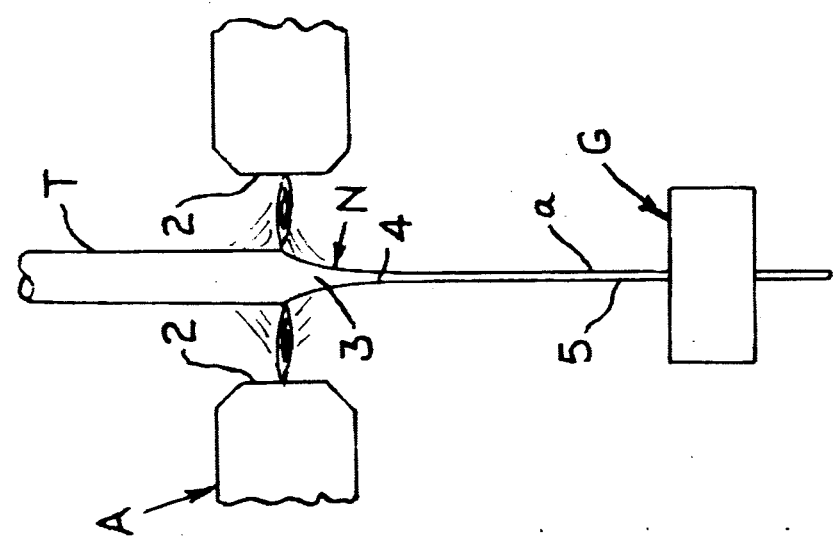
FIG. 1 is a fragmentary schematic elevation view showing apparatus which may be used for drawing silica glass in accordance with one embodiment of the invention.

When making glass cores for D.S. casting, the glass can be drawn in a conventional glass redraw machine such as shown and described in U.S. Pat. No. 3,652,248. That machine is shown schematically in FIG. 1 with parts (such as the cooling means B) omitted. As shown, a cylindrical silica preform T is slowly fed downwardly through a heating annulus A having a burner ring 2 from which oxy-hydrogen flames are directed inwardly against preform T to heat it to a temperature above 1700° C. sufficient for glass drawing. The glass in the neck N cools as it moves from the heat-softened portion 3 to the congealing portion 4 of the neck. As the glass cools, it finally reaches a zone of constant size wherein the hard portion 5 of the glass rod has a fixed cross-sectional size. A thickness gauge G is provided to assist the operator in controlling the drawing operation.

In a typical drawing operation, the porous silica preform T has an outside diameter of from 15 to 20 millimeters and is drawn to form a glass rod or tube with an outside diameter of from 1 to 2 millimeters.

An important feature of the process of this invention is the use of a porous silica preform and shaping the glass under heat in such a way as to produce a dense glass with a large internal surface area suitable for nucleation of cristobalite. The porous preform may be a solid or hollow cylinder suitable for glass drawing or a cup-shaped body suitable for making a glass receptacle or crucible. The preform is preferably made by slip casting and is dried and fired to provide a substantial porosity, such as 10 to 20 volume percent.

The fired porous preform is then heated to provide a high-density silica glass with adequate internal surface area for nucleation of cristobalite. When the preform is drawn to form a glass rod or filament of small diameter, axially oriented striations are provided which become stringy semi-continuous oriented veins 6 of cristobalite embedded in a continuous matrix 7 of vitreous silica as indicated in FIG. 2. When the porous silica preform is sintered in a furnace to form a crucible according to U.S. Pat. No. 3,837,825, the sintering can, for example, be carried out to provide the resulting glass crucible with a porosity of from 0.5 to 4 volume percent and with the internal surface area desired for nucleation of cristobalite.

Glass crucibles can be mass-produced in a economical manner in accordance with the present invention using conventional slip casting and the equipment of said U.S. Pat. No. 3,837,825 and following sintering procedures similar to those described in that patent.

Slip casting can be carried out in a porous mold made of graphite, silica or plaster of Paris (usually the latter) as described in said patent. The slurry containing pulverized vitreous silica suspended in distilled water is poured into the mold to fill the mold cavity. The porous mold draws the water out of the slurry so that after a suitable period of time, such as 10 to 30 minutes or so, the desired thickness will be obtained. At the end of such period, the mold is temporarily turned upside down to remove the excess slurry and then allowed to dry in its upright position. The porous silica preform, crucible or other casting is then removed from the mold and dried thoroughly before firing, for example for 5 to 20 hours or more at a temperature from 50° C. to 200° C.

After the slip-cast crucible is dried and fired, it is preferably subjected to vacuum drying prior to the final sintering operation. Sintering may be effected in equipment of the type disclosed in U.S. Pat. No. 3,837,825, for example. The sintering time and sintering temperatures are selected to provide high-density glass with the desired properties. The furnace temperature at the end of the sintering operation may be as high as 1750° C., but most of the sintering is carried out at a lower temperature in the range of from 1500° C. to 1700° C.

In accordance with the invention, the silica glass is seeded with cristobalite nuclei either by use of alpha cristobalite particles or by nucleation heat treatment which forms such nuclei on nucleation sites provided by internal surfaces of the glass (i.e., internal pores). The nucleation may, for instance, be initiated prior to sintering by heating the dried porous slip-cast crucible either during or after the vacuum drying operation. The nucleation may also be provided during sintering or after the crucible is sintered and delivered to the crystal grower.

The nucleation heat treatment is designed to provide the glass article with a dense concentration of cristobalite nuclei to limit the amount of cristobalite formed during manufacture. The glass crucible leaving the factory contains no more than a few percent by weight of crystalline silica so that it has good thermal shock properties and good flexural strength. This is very important in high-density silica glass to assure that the catastrophic effects of the crystallographic alpha-beta inversion are avoided, and is particularly important for crucibles to be used in Cz crystal growing.

In making glass cores and crucibles according to this invention, it is necessary to form high-density silica glass which has the required nucleation sites and which favors the nucleation and growth of cristobalite. A seeded or nucleated glass is provided which will crystallize at an adequate rate to develop the desired properties in a reasonable period of time when the glass is heated during use.

For example, the striated structure resulting from drawing a porous silica preform according to the invention makes it possible, with a silica glass containing aluminum oxide, to nucleate the drawn glass and to obtain a viscosity of at least 4 times $10^{12}$ poise at 1500° C. before the end of a 20 to 30-minute preheat in the D.S. casting process.

In the case of glass crucibles used in Cz crystal growing furnaces, the present invention provides a homogeneous seeded structure with a dense concentration of cristobalite nuclei so that it becomes possible in some crucibles to convert at least 90 percent by weight of the silica to cristobalite or crystalline silica in 2 to 4 hours or less at 1400° C.

In making high-density glass articles according to this invention, several simple methods may be employed to effect the desired nucleation without forming an excessive amount of cristobalite. A combination of these methods may also be appropriate. The first method involves use of very fine particles of high-purity alpha cristobalite to provide nucleation sites in the glass. In this method, there is added to the silica composition in addition to the aluminum oxide a small amount from 1 to 4 percent by weight of alpha cristobalite with an average particle size of from 0.1 to 5 microns. The cristobalite particles can be thoroughly mixed with the silica particles and uniformly distributed throughout the glass to provide the desired nucleation sites.

A second method involves use of a compound which promotes the formation of cristobalite, such as a sodium compound, which can be subsequently removed in a vacuum furnace. For example, sodium ions can be used to effect nucleation of cristobalite before the silica is sintered to high density and then removed by heating the glass under a high vacuum (e.g., before the final sintering operation). The vacuum treatment can reduce the sodium content from more than 100 ppm to less than 10 ppm.

A third method involves heating the dried slip-cast crucible, which has a porosity of 10 to 15 percent or more, for a time period of at least several hours at a temperature, such as 1200° C. to 1250° C., adequate to form a high concentration of cristobalite nuclei. If desired, this can be done during vacuum drying, but it is preferable to reduce the hydroxyl content to a low value before nucleating substantial amounts of cristobalite.

One of the preferred ways to make a nucleated silica glass according to the invention is to provide a multiplicity of internal pores as nucleation sites and to provide a crystallization aid, such as an aluminum compound. In this method, the cristobalite is sintered in an atmosphere of argon or other inert gas, for example, to provide a porosity of from 0.3 to 3 volume percent or higher. When making crucibles by this method the primary crystallization aid is aluminum oxide in an amount which is preferably no more than 0.1 percent but can be somewhat higher. When slip casting is employed, it is preferable to employ aluminum hydroxide as the additive rather than an aluminum salt, such as aluminum acetate.

When the above method is employed to provide the glass with internal pores as nucleation sites, the furnace temperature can be as high as 1750° C. near the end of the sintering operation to melt out or destroy most or all of the cristobalite nuclei. However, the glass temperature should, of course, be maintained below 1720° C. or below the melting point of cristobalite when relying on seeding by (alpha) cristobalite particles or on cristobalite nuclei formed before sintering or before the glass approaches full density.

In carrying out the process of this invention, nucleation is initiated by heating the silica to a temperature of 1200° C. or higher. When making glass cores using a glass-drawing apparatus, such as that of U.S. Pat. No. 3,652,248, a heat treatment is provided after the glass is drawn to its final thickness. When making glass crucibles, the nucleation may be effected before, during or after the final sintering of the glass.

The heat treatment for silica glass cores is carried out at a temperature of from 1200° C. to 1350° C. for 1 to 10 hours or more to provide the desired cristobalite content which is from 2 to 10 percent in most cores and can be as high as 20 percent by weight. In making cores for D.S. casting, for example, the heat treatment can be for 2 to 5 hours or so at a temperature from 1200° C. to 1250° C. to provide a cristobalite content of from 2 to 6 percent by weight and a viscosity at 1450° C. of from 1.5 to 5 times $10^{12}$ poise.

The maximum cristobalite content depends on the size of the core and strength requirements. A high flexural strength is important to prevent core breakage during pattern stuffing, core dressing, assembly handling and wax removal. It is particularly important in D.S. cores with a diameter of 1 to 3 millimeters or less, and it is preferable to limit the cristobalite content so that the modulus of rupture at 25° C. is at least 800 and preferably at least 1000 kilograms per square centimeter (see FIG. 4).

The process of this invention can be employed to produce silica glass rods, tubes, strips and filaments with cristobalite contents of 20 percent by weight or more and viscosities of $10^{13}$ to $10^{14}$ poise or higher at 1500° C. where flexural strength is less important. Such cristobalite-reinforced silica glass articles can be used in metal casting and in various other high-temperature applications. For example, drawn silica glass rods or tubes with a cristobalite content of 25 percent by weight can be used as internal reinforcing in a composite article.

Figure 8:
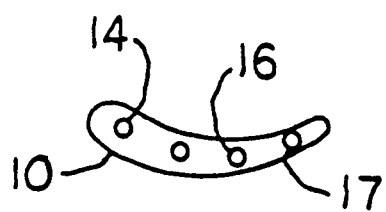
FIG. 8 is an end view of the core and pattern.
Figure 6:
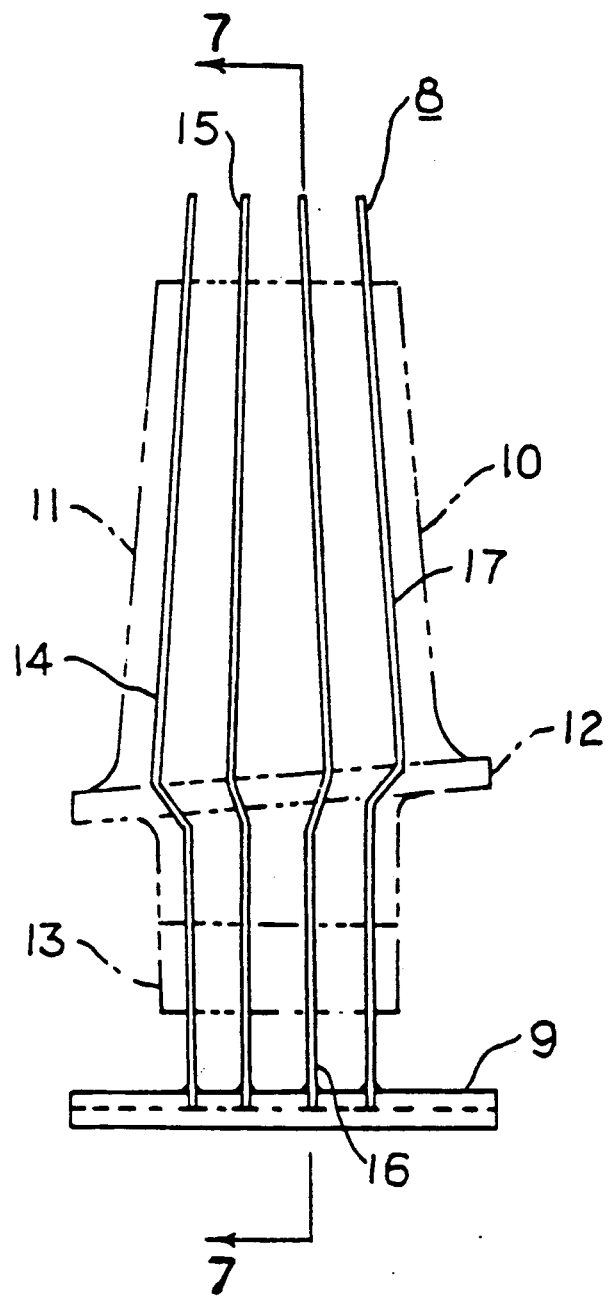
FIG. 6 is a top view of a silica glass core showing the associated wax pattern in broken lines.
Figure 7:
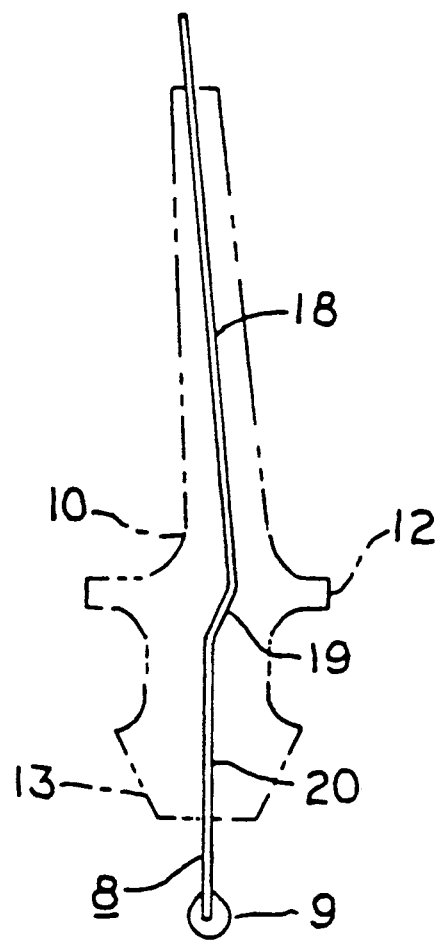
FIG. 7 is a side view of the core and pattern.

Drawn silica glass tubes made in accordance with this invention are well suited for use in conventional cores of the type shown in FIGS. 6 to 8 designed for investment casting, particularly D.S. monocrystal casting at temperatures above 450° C. The glass core 8 consists of a series of bent glass tubes 14 to 17 rigidly mounted on a vitreous silica base 9. A molded wax pattern 10 covers the glass tubes and has tapered forward portion 11, a narrow intermediate portion 12 and a tapered rear portion 13.

Each of the silica glass tubes 14 to 17 is made according to the present invention. After the glass-drawing and heat-treating operations, the tubes are bent to provide a long straight portion 18 with a length greater than that of the wax portion 11, a short inclined portion 19, and a straight portion 20 with a length greater than that of the portion 13 of the pattern. The core 8 is drawn to scale in FIGS. 6 to 8. It has excellent sag resistance and functions well in the conventional D.S. casting process with glass tubes having diameters of from 1 to 2 millimeters or less, even when the metal pouring temperature is in the range of 1500° C. to 1550° C. Such a core is suitable for use in D.S. casting processes as described, for example, in U.S. Pat. Nos. 3,700,023 and 4,093,017.

When making silica glass crucibles according to another embodiment of the invention, conventional slip casting is preferably employed using a silica composition similar to that used for making the cores described above. The composition consists of treated vitreous silica particles with a purity of at least 99.99 percent and from 0.01 to 0.04 percent by weight of aluminum oxide particles with a purity of at least about 99 percent (i.e., $Al_2O_3$ or a hydrated form, $Al_2O_3 \cdot x\ H_2O$).

The crucible can be slip cast, dried and fired in a conventional manner as disclosed, for example, in U.S. Pat. No. 3,972,704 and then sintered to high density in a semi-automatic furnace of the type disclosed in that patent.

For example, after the porous slip-cast crucible is thoroughly dried and fired to eliminate the combustibles and to provide adequate strength for handling, it is placed in a vacuum furnace and heated to a temperature of from 1150° to 1200° C. for a period of from 3 to 4 hours to reduce the hydroxyl content of the glass to a low level, preferably no more than 0.002 percent by weight. The subatmospheric pressure in the vacuum furnace is less than 10 torrs and preferably from 0.5 to 5 torrs or less.

After vacuum drying, the final sintering operation can, for example, be carried out in the apparatus of said U.S. Pat. No. 3,972,704, with an atmosphere of argon or other inert gas using a suitable sintering temperature in the range of from about 1600° C. to about 1700° C. and a sintering time, such as 4 to 10 minutes. If desired the sintering can be carried out rapidly according to said patent. The furnace temperature can be 1750° C. or higher at the end of the sintering operation.

In one of the preferred processes, the crucible is placed upside down on a mandrel according to U.S. Pat. No. 3,972,704 and sintered to a density of from 97 to 98 percent in a period of from 5 to 8 minutes or so while heating the crucible to a temperature above 1700° C. The furnace is operated in a conventional manner so that most of the sintering occurs as the glass is heated from 1600° C. to 1700° C., and the final glass temperature is about 1750° C. and high enough to melt out or destroy all or almost all of the cristobalite.

For example, a silica glass crucible formed in this manner according to the present invention having a porosity of from about 2 to about 3 percent and substantially free of cristobalite is well suited for use in growing silicon monocrystal in a Czochralski furnace. The internal pores of the sintered glass provide the sites for nucleation of cristobalite, and the aluminum oxide provides the desired rate of crystallization. The sintered glass crucible is preferably subjected to a nucleation heat treatment before use in the Cz furnace, for example by heating the crucible for 2 to 5 hours at a temperature in the range of from 1200° C. to 1250° C. to form a dense concentration of cristobalite nuclei. The nucleated crucible contains a very small amount of cristobalite, no more than a few percent by weight. It is not damaged when cooled due to the alpha-beta inversion and may be stored at room temperature before being used in crystal growing.

Such a nucleated silica glass crucible may be used in a Cz crystal-growing furnace much like a conventional crucible. For example, during the initial preheat and melt down in a conventional Cz furnace having a high vertical temperature gradient, such as 500 degrees C., the bottom portion of the silica crucible within the surrounding graphite cup may be heated for 2 hours or so at about 1500° C. and caused to crystallize while the top portion of the crucible is at a temperature of about 1000° C. and does not crystallize. The initial concentration of cristobalite nuclei in the glass due to the aforesaid nucleation heat treatment is high enough so that, in the Cz furnace, most of the crucible is converted to cristobalite within a short time period, such as 90 to 120 minutes.

During crystal growing, the temperature of the crucible below the melt line is above 1400° C. and sufficient t complete the crystallization of the glass, but the uppermost portions of the crucible remain at temperatures below 1100° C. and do not crystallize substantially. The portions of the crucible wall near the initial melt line are perhaps the most critical because of the sudden change from amorphous to crystalline glass along a narrow zone. However, in spite of this, crucibles made according to this invention are reliable and well suited for use in conventional Cz furnaces.

It is the durability and reliability of the cristobalite crucible of this invention and its remarkable resistance to attack by molten silicon that makes it possible to minimize the crucible cost and to minimize contamination. Crucibles made in the manner described above can be reused 2 to 5 times or more over an extended time period such as 60 hours or more.

While excellent results can be obtained with crucibles where the final sintering temperature exceeds 1750° C., it will be understood that the sintering temperature may be maintained below 1700° C. or below the melting point of cristobalite and that the sintering may be effected in helium or in a vacuum, especially when the glass is seeded by use of alpha cristobalite particles. For example, the glass can be sintered to full or essentially full density while retaining the cristobalite nuclei.

Figure 9:
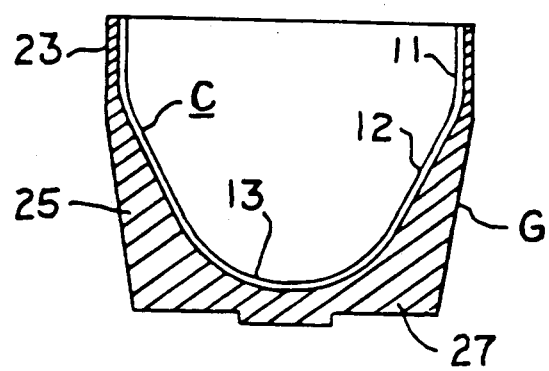
FIG. 9 is a vertical cross section of a tapered crucible and graphite cup made according to the invention on a reduced scale.
Figure 10:
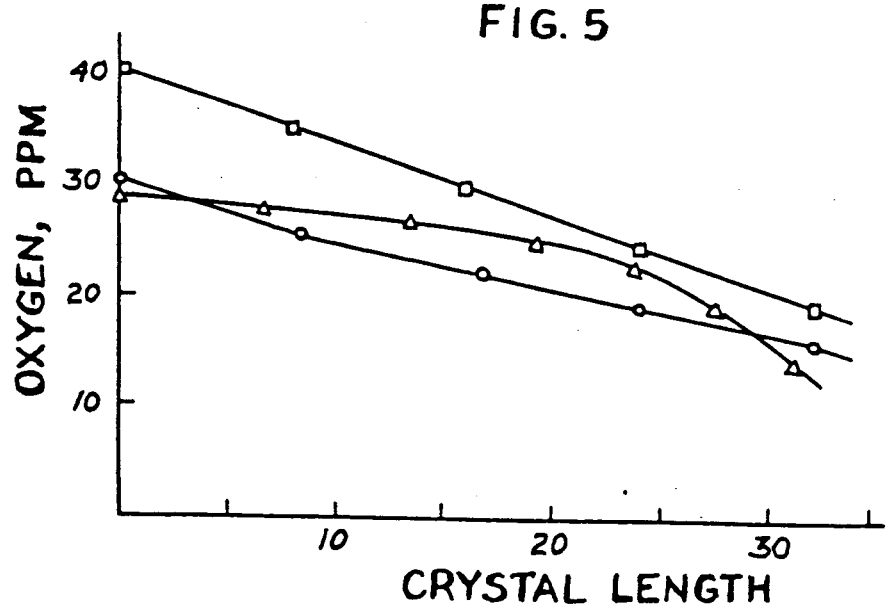

The procedures described above can be used to make the tapered crucible C of FIG. 9 or a crucible of conventional shape. As shown in that figure, the crucible fits inside a round graphite cup G having a thin upper portion 23, a tapered intermediate portion 25, and a bottom portion 27 similar to that of the graphite cup 30, (FIG. 11). The outer surface of the portion 25 is preferably tapered but can be cylindrical.

In order to ascertain the effect of certain variables on the physical properties of silica glass rods or tubes made according to the present invention, a number of test specimens were prepared using different silica compositions and different treatments and data was obtained as to the modulus of rupture and high temperature properties of the various specimens. Some of the test results which are believed significant are illustrated graphically in FIGS. 3 to 5 to facilitate an understanding of the invention.

The various glass test specimens in the form of rods or tubes were prepared generally by the process described hereinafter in more detail in Example I in which a slip consisting essentially of vitreous silica particles and small amounts of aluminum hydroxide is used for slip casting a cylindrical porous silica preform which is then dried and fired at about 1180° C. for about 3 hours and drawn to final size in a redraw apparatus of the type shown and described in U.S. Pat. No. 3,652,248 using a oxy-hydrogen flame in the heating zone and air cooling jets several inches below said zone to improve dimensional control.

Each of the porous silica preforms used for making the various test specimens is drawn from an outside diameter of about 0.75 inch to an outside diameter of approximately 0.05 inch and the resulting glass rod or tube is cut into short lengths, such as 6-inch lengths, and subsequently heat-treated at about 1260° C. for either 2 hours or 4 hours to develop cristobalite. Most of the specimens were cylindrical glass tubes with an internal diameter of about 0.017 inch drawn from a preform having an internal diameter of about 0.25 inch, and all of such tubes were drawn to almost the same diameter.

Figure 3:
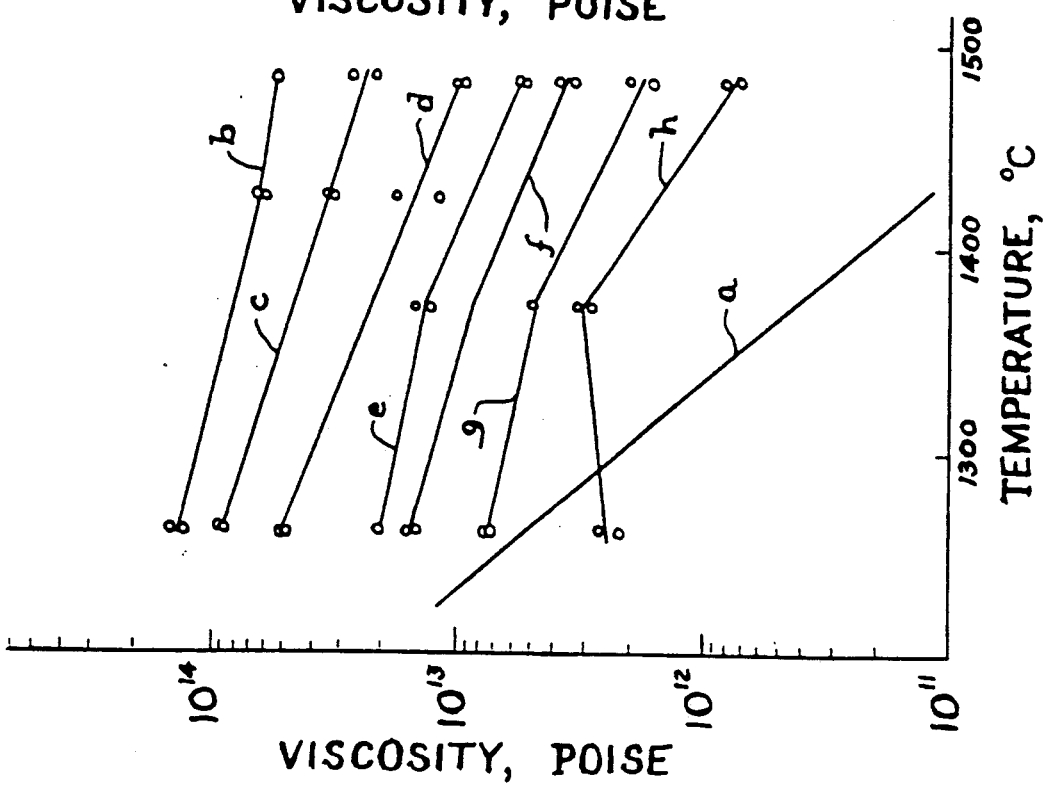
FIG. 3 is a graph indicating the effect of temperature and cristobalite content on the viscosity of the silica glasses of this invention as compared to fused silica.

FIG. 3 indicates the results of viscosity tests on various specimens b through h at differing cristobalite levels and provides a comparison with conventional fused quartz (vitreous silica) tubing (a) whose viscosity decreases in a straight line from above $10^{12}$ poise at 1200° C. to below $10^{11}$ poise at 1450° C. The test specimens of the silica glasses identified as b, and d in FIG. 3 were solid glass rods. The test specimens of the glasses e through h were glass tubes. All of the rods and tubes had[a low hydroxyl content because of a prenucleation vacuum heat treatment for at least about 2 hours at a temperature of about 1120° C. to remove most of the chemically combined water. The specimens for the silica glasses b and e were heat-treated for about 4 hours at a temperature of about 1260° C. to develop substantial amounts of cristobalite (about 25 percent and about 3.5 percent, respectively whereas the remaining specimens for glasses c, d, f, g and h were heat-treated at the temperature for only 2 hours. The test data indicates that all of the silica glasses containing cristobalite had a viscosity much greater than that of the vitreous silica (tubing a) specimen at metal casting temperatures, such as 1350° C., 1450° C. or higher. The glasses of FIG. 3 are identified in Table I below.

TABLE I

| Composition | Percent $Al_2O_3$ | Percent by Vol. Cristobalite |
|---|---|---|
| a | 0 | 0 |
| b | 0.3 | 25 |
| c | 0.3 | 11 |
| d | 0.2 | 6 |
| e | 0.1 | 3.5 |
| f | 0.1 | 3 |
| g | 0.05 | 2 |
| h | 0.025 | 1.7 |

Figure 5:
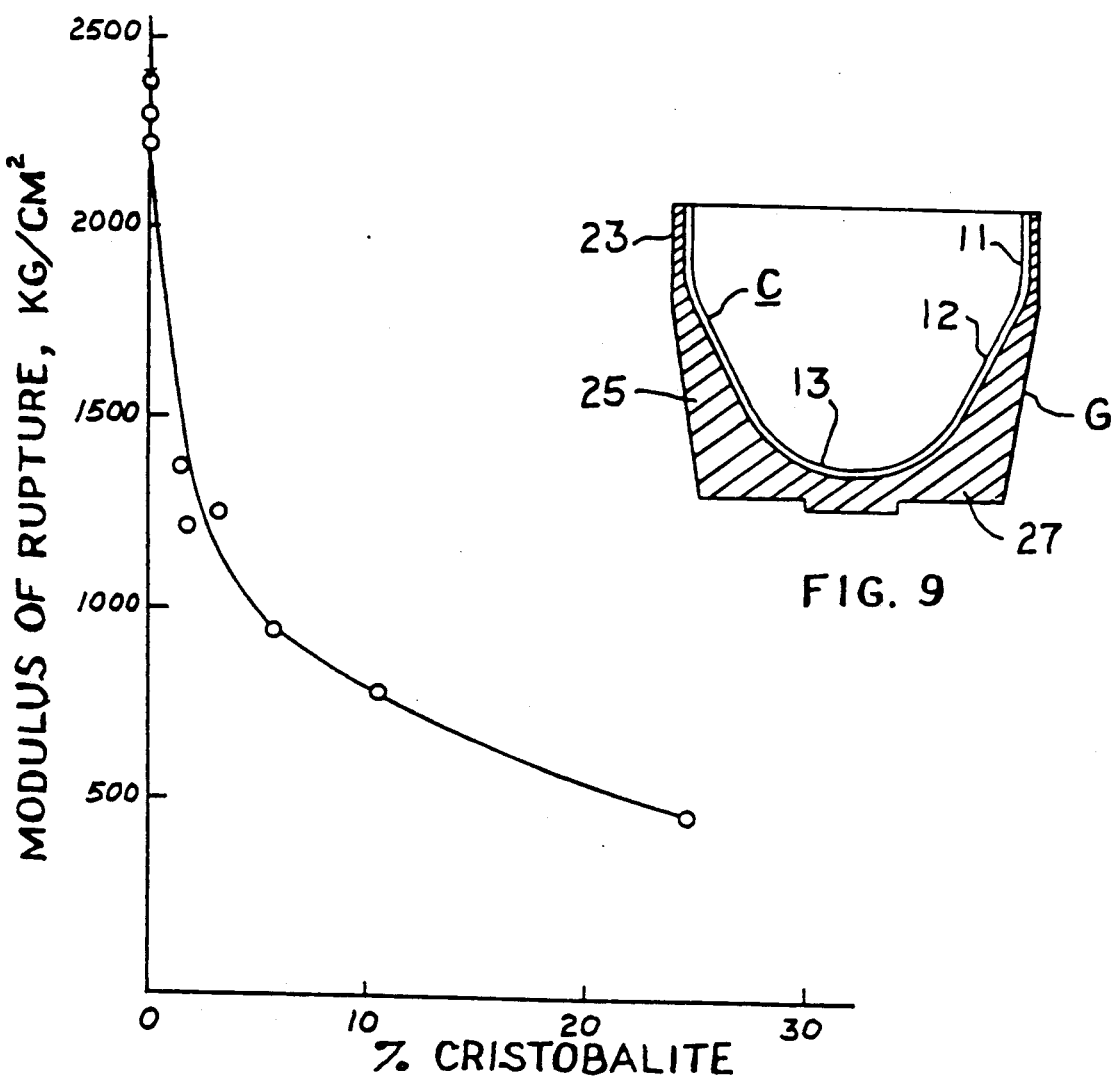
FIG. 5 is a graph indicating the effect of cristobalite content on the viscosity of silica glass at a given high temperature.

FIG. 5 shows the effect of cristobalite level in the glasses b through h on the viscosity at 1480° C. As indicated, similar glass tubing drawn from a slip-cast preform and free of cristobalite has a viscosity well below $10^{11}$ poise.

A silica glass core used for D.S. monocrystal casting should have a viscosity of at least $10^{12}$ poise at 1450° C. and preferably has a viscosity of at least 1.5 times $10^{12}$ poise at 1450° C. when making tubing with an external diameter of 0.1 inch or less. The present invention facilitates manufacture of glass tubes and filaments with viscosities of at least 4 times $10^{12}$ at 1500° C. which are well suited for use at temperatures well in excess of those encountered in the D.S. casting process.

Although resistance to deformation at high temperature is very important in a glass core, it is also important to provide good low temperature properties, especially when making cores with diameters of 0.05 inch or less. A glass core for D.S. casting preferably has a flexural strength or modulus of rupture at 25° C. of at least 800 kilograms per square centimeter (11,400 psi).* The amount of cristobalite must be limited because of the deterioration caused during the crystallographic alpha-beta inversion.

*The modulus of rupture is set forth herein as a force in pounds or kilograms per unit area.

Figure 4:
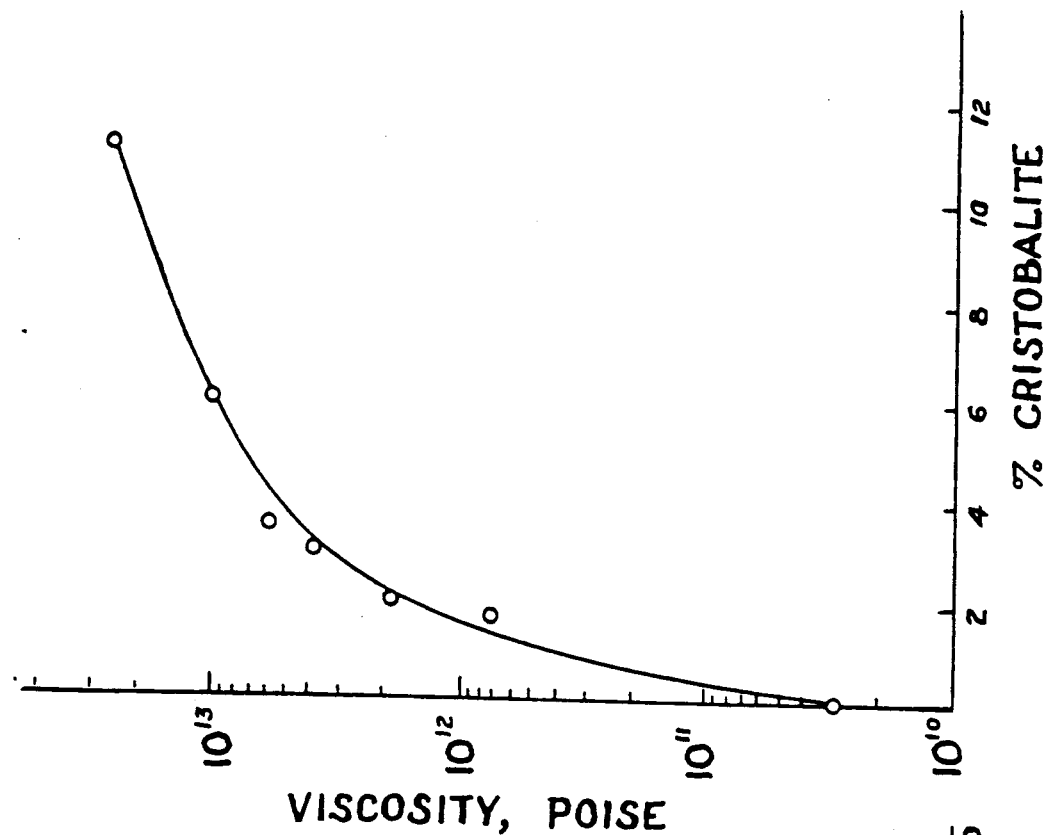
FIG. 4 is a graph indicating the effect of cristobalite content on the modulus of rupture of silica glass made in accordance with the invention.

The effect of increasing cristobalite content on the modulus rupture $Kg/cm^2$ at room temperature for the above glasses b through h is shown in FIG. 4. The room temperature modulus for glasses e, f and g is in the range of from about 1200 to about 1250 $Kg/cm^2$ and for glass b is below 500 $Kg/cm^2$. The modulus is well above 2000 $Kg/cm^2$ for the cristobalite-free silica glass as drawn or after treatment in the vacuum furnace.

The present invention provides crucibles suitable for use with modern Cz crystal-growing furnaces designed for growing silicon monocrystals with a diameter from 4 to 6 inches or so and does not require substantial changes in the apparatus. The crucibles improve the operation of large modern Cz crystal-growing furnaces with charge capacities in excess of 50 kilograms designed to grow 6-inch silicon crystal. Such furnaces are used extensively in the industry and are described on pages 33 to 40 of "Semiconductor International", February 1982.

FIG. 9 shows on a reduced scale one simple form of crucible C which may be employed in the practice of this invention. Such crucibles may be made in various sizes with diameters from 12 to 20 inches and wall thicknesses from 0.1 to 0.4 inch. For example, when growing silicon monocrystal with a diameter of 100 mm (4 inches), the crucible C may have an upper cylindrical wall portion 11 with an inside diameter of 12 inches and a height of about 3 inches, a frustoconical intermediate portion 12, and a rounded bottom portion 13. Such a 12×10 crucible has an overall height of about 10 inches and is designed to receive a 16 kilogram charge of molten silicon which is reduced to about 2 kilograms after growing 27 inches of 100 mm monocrystal.

The basic procedures set forth in the examples which follow are capable of providing silica glass cores appropriate for use in conventional D.S. monocrystal casting processes and make it possible to produce drawn glass rods and tubes with a viscosity at 1450° C. in the range of from $10^{12}$ to $10^{13}$ poise and with excellent flexural strength (e.g., a modulus or rupture at 25° C. in excess of 1000 $Kg/cm^2$). However, superior results are obtained in core manufacture when the vitreous silica particles and the added aluminum oxide particles of the silica composition contain minimum amounts of unwanted metal oxide impurities.

The silica composition used in the slip casting operation is preferably formed from fine vitreous silica particles which have been treated to provide a purity of at least about 99.99 percent, and improved results are obtained when the high purity aluminum oxide particles added to said composition contain a minimum amount (e.g., less than 0.02 percent by weight) of metal oxide impurities. Best results are obtained when the drawn glass is treated in a vacuum furnace for at least several hours to reduce the hydroxyl content below 0.004 percent by weight.

EXAMPLE I

A high-purity fused silica slip is prepared by wet milling high-purity fused silica (99.98% $SiO_2$) using deionized water and a high-purity fused silica grinding media in a urethane-lined mill. Aluminum hydroxide is added to the mill in an amount that provides from 0.20 to 0.25 percent by weight of aluminum oxide ($Al_2O_3$) in the composition. The average particle size of the silica is reduced to less than 10 microns in the grinding operation and the pH is adjusted to about 7.5 by adding some ammonium hydroxide.

The resulting slip is cast in a conventional plaster of Paris mold to produce a hollow cylindrical preform with an external diameter of about 1.9 centimeters and an internal diameter of about 0.6 centimeter. The tubular preform is then dried and fired at a temperature of about 1180° C. for 3 hours to develop strength for handling.

The fired porous silica preform is then placed in a glass redraw machine as disclosed in U.S. Pat. No. 3,652,248 and shown schematically in FIG. 3 hereof and is heated by an oxyhydrogen flame to a drawing temperature, such as 1800° C. to 1900° C. Essentially full density glass is produced by drawing the silica of the preform into a continuous hollow fiber or filament having a suitable external diameter, such as 1.3 to 2 millimeters. The drawn vitreous silica glass is then cut to the desired lengths and used to form a glass cor suitable for directional solidification casting of turbine engine parts. The glass is bent, spliced and/or ground in the conventional manner to provide a core of the desired configuration.

The core is subsequently heat treated for 2 to 3 hours at a temperature of about 1200° C. to cause partial devitrification of the silica glass and to provide a cristobalite content of from about 2 to about 5 percent by weight. The glass of the resulting core has fibrous axially oriented veins of cristobalite embedded in a continuous matrix of vitreous silica. After the core is cooled (through the alpha-beta inversion) to room temperature, it has excellent flexural strength and outstanding resistance to deformation at temperatures of 1450° C. and above, which is much greater than that of high-purity fused silica.

EXAMPLE II

A glass filament is drawn from a silica preform and cut to size as in the previous example and then used to form glass cores. Each core is heat treated in the same way as in that example except that chemically-bound water is removed from the drawn glass before such heat treatment. The core is placed in a furnace maintained under a high vacuum and heated for 2 to 4 hours at a temperature of from 1040° C. to 1150° C. to reduce the hydroxyl content of the glass to less than 0.004 percent by weight.

EXAMPLE III

Glass cores are prepared using the procedure of Example I except that the amount of aluminum hydroxide is increased from about 22 grams to about 33 grams for each 20 pounds (9070 grams) of the fused silica slip.

EXAMPLE IV

Glass cores prepared according to Examples I, II and III comprising full-density tubes with an external diameter of from 1.3 to 1.8 millimeters are located in wax patterns in the form of turbine blades and employed in a conventional lost-wax process in which a multilayer shell mold is formed on each wax pattern and the wax is thereafter removed by flash firing. The shell molds containing the turbine-blade cores are stored at room temperature and thereafter used in a conventional directional solidification (D.S.) casting process wherein each mold is preheated for one-half hour at 1400° C. prior to pouring of the molten superalloy. The metal is gradually solidified over a period of one hour. The resulting turbine-blade casting is then cooled to room temperature, the shell mold is broken away, and the core is removed by leaching in caustic.

The glass tubes of the cores of Examples I, II and III are able to function well in the D.S. process of this Example because of the outstanding reinforcement provided by the fibrous oriented veins of cristobalite. It is possible to obtain a reinforced glass which has a viscosity at 1500° C. of 2 to 4 times $10^{12}$ poise or higher after the preheat and before the molten metal is poured into the mold. Such high viscosity can be achieved while retaining good room temperature properties, and such glass can be provided with a modulus of rupture at 25° C. of 1000 Kg/cm$^2$ or higher.

The aluminum compound (hydrated aluminum oxide) employed in Example I can be essentially pure or a material containing up to one percent of metal oxide impurities. Best results are obtained when the silica used for slip-casting has a purity at least 99.99 percent.

The glass cores of this invention are particularly desirable for gas turbine engines because of the added flexibility in turbine airfoil design which permits smaller cooling passages and more complicated designs. The improved glass cores are important not only because of their reliability and remarkable resistance to sag during metal casting but also because the hollow cores can be readily removed from the casting by leaching. The added strength of a solid core is not needed.

It will be understood that variations and modifications of the specific embodiments disclosed herein may be made without departing from the spirit of the invention.

What is claimed is:

1. A process of making a silica glass with thermal shock resistance comprising shaping a refractory composition containing at least 95 percent by weight of fine vitreous silica particles and from 0.02 to 0.5 percent by weight of crystallization promoting metallic oxides to form a porous preform, heating the preform to a temperature sufficient to permit viscous flow, deforming the same to reduce the cross-sectional area at least 90 percent and to form an extended glass structure having a multiplicity of axially oriented striations embedded in a continuous matrix of vitreous silica, said composition being such that heating of said glass structure for 4 to 8 hours at a temperature of 1250° C. forms from 2 to 10 percent by weight of cristobalite concentrated at said striations, and heating said glass structure to a temperature of at least 1200° C. for a period of time to effect crystallization and to provide the silica glass with a viscosity at 1450° C. of at least $10^{12}$ poise.

2. A process according to claim 1 wherein said composition contains particles of an aluminum compound that promotes the growth of cristobalite and is heated to a temperature of at least 1200° C. for a period of time to effect crystallization and to provide the silica glass with a viscosity at 1450° C. of at least $10^{12}$ poise, said aluminum compound providing from 0.04 to 0.5 percent by weight of aluminum oxide.

3. A process according to claim 1 wherein said preform is heated and drawn to a diameter no greater than 2 millimeters to form an amorphous silica glass filament with a density of at least 98 percent by weight.

4. A process comprising the steps of shaping a refractory composition containing at least 95 percent by weight of vitreous silica particles and at least 0.02 percent by weight of metallic oxides which promote the formation of cristobalite to form a porous preform with a porosity of at least 10 percent, heating the preform to a temperature sufficient to permit viscous flow and deforming the same to reduce the cross-sectional area at least 90 percent and to form a dense extended glass structure having a multiplicity of axially oriented striations embedded in a matrix of vitreous silica, causing nucleation at a multiplicity of sites formed by said striations to provide a dense concentration of internal cristobalite nuclei, heating the glass at a temperature of at least 1200° C. to effect crystallization at said striations and to form a multiplicity of axially oriented veins of cristobalite embedded in said matrix and to provide the glass with a cristobalite content of from 2 to 10 percent and a viscosity at 1450° C. of at least $10^{12}$ poise.

5. A process according to claim 4 wherein said refractory composition contains an aluminum compound that promotes the growth of cristobalite, said compound providing from 0.02 to 0.5 percent by weight of aluminum oxide.

6. A process according to claim 4 wherein the glass is placed within a refractory mold and preheated with the mold from a temperature below 100° C. to a temperature of from about 1400° C. to about 1550° C. for a period of from about 20 to about 60 minutes to form at least 10 percent by weight of cristobalite concentrated at said striations and to provide the glass with a viscosity at 1500° C. of at least 4 times $10^{12}$ poise, and molten metal is thereafter caused to enter the preheated mold.

7. A process according to claim 4 wherein said preform is heated to the viscous state and drawn to form an amorphous glass filament.

8. A process according to claim 7 wherein the drawn filaments are employed for fabrication of a shaped refractory article which is thereafter heated to a temperature above 1200° C. to effect said crystallization at said striations.

9. A process for making a silica glass article with high thermal shock resistance comprising providing a refractory composition consisting essentially of fine particles of high-purity vitreous silica and an aluminum compound that promotes the growth of cristobalite, said aluminum compound providing from about 0.02 to 0.4 percent by weight of added aluminum oxide, shaping said composition to form a silica body with a porosity of at least 10 volume percent, heating and shaping the silica body to coalesce the silica particles, to cause nucleation of cristobalite at a multiplicity of internal nucleation sites, and to form a high-density glass having a dense concentration of internal cristobalite nuclei, the heating of the silica being controlled to limit the crystallization and to provide an essentially vitreous glass with a modulus of rupture at 25° C. of at least 800 kilograms per square centimeter and a high resistance to thermal shock, cooling the resulting high-density vitreous glass to a temperature below 100° C., thereafter preheating the glass to a temperature of from about 1400° C. to about 1550° C. to crystallize the glass, and thereafter causing molten metal to contact the glass.

10. A process for making a refractory silica article with high thermal shock resistance comprising providing a refractory composition consisting essentially of fine particles of high-purity vitreous silica and an aluminum compound that promotes the growth of cristobalite, said aluminum compound providing from about 0.02 to about 0.4 percent by weight of added aluminum oxide, shaping said composition to form a silica body with a porosity of at least 10 volume percent, heating and shaping the silica body to coalesce the silica particles, to nucleate cristobalite at a multiplicity of internal nucleation sites, and to form a shaped glass body having a dense concentration of internal cristobalite nuclei, the heating of the silica being controlled to limit devitrification and to provide an essentially vitreous glass body with a modulus of rupture at 25° C. of at least 800 kilograms per square centimeter, the degree of nucleation in said glass body being such that heating of the glass for one hour at a temperature of 1450° C. will increase the cristobalite content to above 10 percent by weight.

11. A process according to claim 10 wherein said glass body is heated under a vacuum to remove sodium ions and to reduce the hydroxyl content to no more than 0.005 percent by weight.

12. A process according to claim 10 wherein said porous silica body is formed from said particles by slip casting, the nucleated high-density glass body is preheated from a temperature below 100° C. to a temperature of from about 1400° C. to about 1550° C. to crystallize the silica and thereby increase its resistance to deformation, and molten metal is thereafter caused to contact the shaping surfaces of the preheated glass body.

13. A process according to claim 10 wherein said porous silica body is heated to a temperature sufficient to permit viscous flow and drawn to form a refractory glass core with an external diameter of from 1 to 3 millimeters having axially oriented striations located in a matrix of vitreous silica, the core is placed within a refractory mold and preheated with the mold to a temperature of from about 1400° C. to about 1550° C. for a period of from 20 to 60 minutes to form at least 10 percent of weight of cristobalite concentrated at said striations and to provide the glass with a viscosity at 1500° C. of at least 4 times $10^{12}$ poise; and thereafter molten metal is caused to enter the preheated mold and to flow around the core.

14. A process according to claim 9 wherein the porous silica body is heated to a temperature sufficient to permit viscous flow and drawn to form an essentially vitreous silica glass filament with an external diameter of from 1 to 3 millimeters having axially oriented striations located in a matrix of vitreous silica, and said filament is heated to a temperature of at least 1200° C. to effect crystallization at said striations and to provide the glass with a cristobalite content of from 2 to 10 percent and a viscosity at 1450° C. of at least $10^{12}$ poise.

15. A drawn silica glass with high thermal shock resistance made from a shaped porous preform comprising a refractory composition containing at least 95 percent by weight of vitreous silica particles and at least 0.02 percent by weight of crystallization-promoting metallic ions by heating the preform to permit viscous flow and drawing the same to reduce the cross-sectional area at least 90 percent and to provide a multiplicity of axially oriented veins of insitu-formed cristobalite embedded in a continuous matrix of vitreous silica; said glass containing at least 80 percent by weight of vitreous silica and from 2 to 20 percent by weight of cristobalite, having a modulus of rupture at 25° C. of at least 800 kilograms per square centimeter, having a viscosity at 1450° C. of at least $10^{12}$ poise, having an hydroxyl content of no more than 0.005 percent by weight, and having a sodium content of no more that 0.005 percent by weight; said glass having a dense concentration of internal cristobalite nuclei, the degree of nucleation being such that heating of the glass for one hour at a temperature of 1450° C. will increase the cristobalite content to above 10 percent by weight and provide the glass with a viscosity at 1500° C. of at least 4 times $10^{12}$ poise.

16. A quartz glass receptacle formed from a refractory composition consisting essentially of fine particles of high-purity vitreous silica and particles of an aluminum compound that promotes the growth of cristobalite, said compound providing from about 0.02 to 0.4 percent by weight of aluminum oxide, the glass of said receptacle being essentially vitreous and having high thermal shock resistance and a dense concentration of crystallization-promoting cristobalite nuclei throughout the glass such that a major portion of the glass can be converted from vitreous silica to cristobalite when heated for two hours at 1400° C.

17. A quartz glass article according to claim 16 made by shaping a refractory silica composition containing vitreous silica particles having an average particle size of from 1 to 10 microns and particles of an aluminum compound that promotes the growth of cristobalite to form a porous cup-shaped silica body having a wall thickness of from 0.1 to 0.3 inch, removing water from the body, and sintering the shaped body at a temperature of at least 1500° C. to coalesce the silica particles, said silica body being heated at a temperature above 1100° C. for a substantial period of time to induce nucleation and to provide a dense concentration of cristobalite nuclei.

18. A process for making a refractory silica glass with high thermal shock resistance comprising shaping a refractory composition containing at least 95 percent by weight of fine vitreous silica particles and from 0.02 to 0.5 percent by weight of crystallization-promoting metallic oxides to form a silica preform with a porosity of at least 10 volume percent and a multiplicity of internal nucleation sites, heating the silica preform to coalesce the silica particles, to nucleate cristobalite at said nucleation sites, and to form a high density glass body having a dense concentration of internal cristobalite nuclei, the heating of the silica being controlled to limit devitrification and to provide a vitreous glass with a modulus of rupture at 25° C. of at least 800 kilograms per square centimeter, the degree of nucleation in said vitreous glass being such that heating of the glass for one hour at a temperature of 1450° C. will increase the cristobalite content to above 10 percent by weight.

19. A process according to claim 18 wherein a shaped mold part made from said vitreous glass is cooled to a temperature below 100° C. and then preheated to a temperature of from about 1400° C. to about 1550° C. to crystallize the glass, and thereafter molten metal at a temperature of at least 1500° C. is caused to contact the glass of the preheated mold part during metal casting.

20. A process according to claim 19 wherein said refractory composition consists essentially of fine particles of high-purity vitreous silica and an aluminum compound that promotes the growth of cristobalite, said aluminum compound providing at least 0.02 percent by weight of added aluminum oxide, and wherein the shaped mold part is a core and is sintered at a temperature below 1720° C. to avoid loss of cristobalite.

* * * * *